(12) United States Patent
Chuang

(10) Patent No.: US 10,862,464 B1
(45) Date of Patent: Dec. 8, 2020

(54) COMPARING DEVICE AND METHOD OF CONTROLLING COMPARING DEVICE

(71) Applicant: TAIWAN SEMICONDUCTOR MANUFACTURING COMPANY LTD., Hsinchu (TW)

(72) Inventor: Mei-Chen Chuang, Pingtung County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/548,851

(22) Filed: Aug. 23, 2019

(51) Int. Cl.
- *H03K 3/356* (2006.01)
- *H03K 5/24* (2006.01)
- *G05F 1/44* (2006.01)
- *G05F 3/26* (2006.01)

(52) U.S. Cl.
CPC ......... *H03K 3/356121* (2013.01); *G05F 1/44* (2013.01); *G05F 3/262* (2013.01); *H03K 5/249* (2013.01); *H03K 5/2481* (2013.01)

(58) Field of Classification Search
CPC ............ H03K 3/356; H03K 3/356104; H03K 3/356113; H03K 3/356121; H03K 5/22; H03K 5/24; H03K 5/2472; H03K 5/2481; H03K 5/249; G05F 1/10; G05F 1/12; G05F 1/40; G05F 1/44; G05F 1/445; G05F 1/45; G05F 1/452; G05F 1/455; G05F 3/02; G05F 3/08; G05F 3/12; G05F 3/16; G05F 3/20; G05F 3/25; G05F 3/262
See application file for complete search history.

(56) References Cited

U.S. PATENT DOCUMENTS

| | | | |
|---|---|---|---|
| 10,348,535 B1* | 7/2019 | Kumar | H04B 3/32 |
| 2006/0172783 A1* | 8/2006 | Leung | H03K 3/356121 455/572 |
| 2007/0236271 A1* | 10/2007 | Nuebling | H03K 3/356104 327/333 |

* cited by examiner

*Primary Examiner* — Diana J. Cheng
(74) *Attorney, Agent, or Firm* — WPAT, P.C., Intellectual Property Attorneys; Anthony King (57) ABSTRACT

A comparing device includes: a first current generating circuit arranged to selectively generate a first current according to a first control signal; a second current generating circuit arranged to generate a second current; and a comparing circuit having a common node coupled to the first current generating circuit and the second current generating circuit for comparing a first input signal and a second input signal to generate an output signal according to the first current, the second current, and a second control signal.

20 Claims, 8 Drawing Sheets

COMPARING DEVICE AND METHOD OF CONTROLLING COMPARING DEVICE

BACKGROUND

A comparator is commonly used to compare the voltage levels of two input signals. For example, in a successive approximation register analog-to-digital converter (SAR-ADC), a comparator may be applied to successively compare an analog input signal with a plurality of reference voltage levels for sampling the analog input signal. The operating speed of the comparator may affect the bit number or resolution of the SAR-ADC. Therefore, a high speed comparator is highly desirable in the field of ADC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
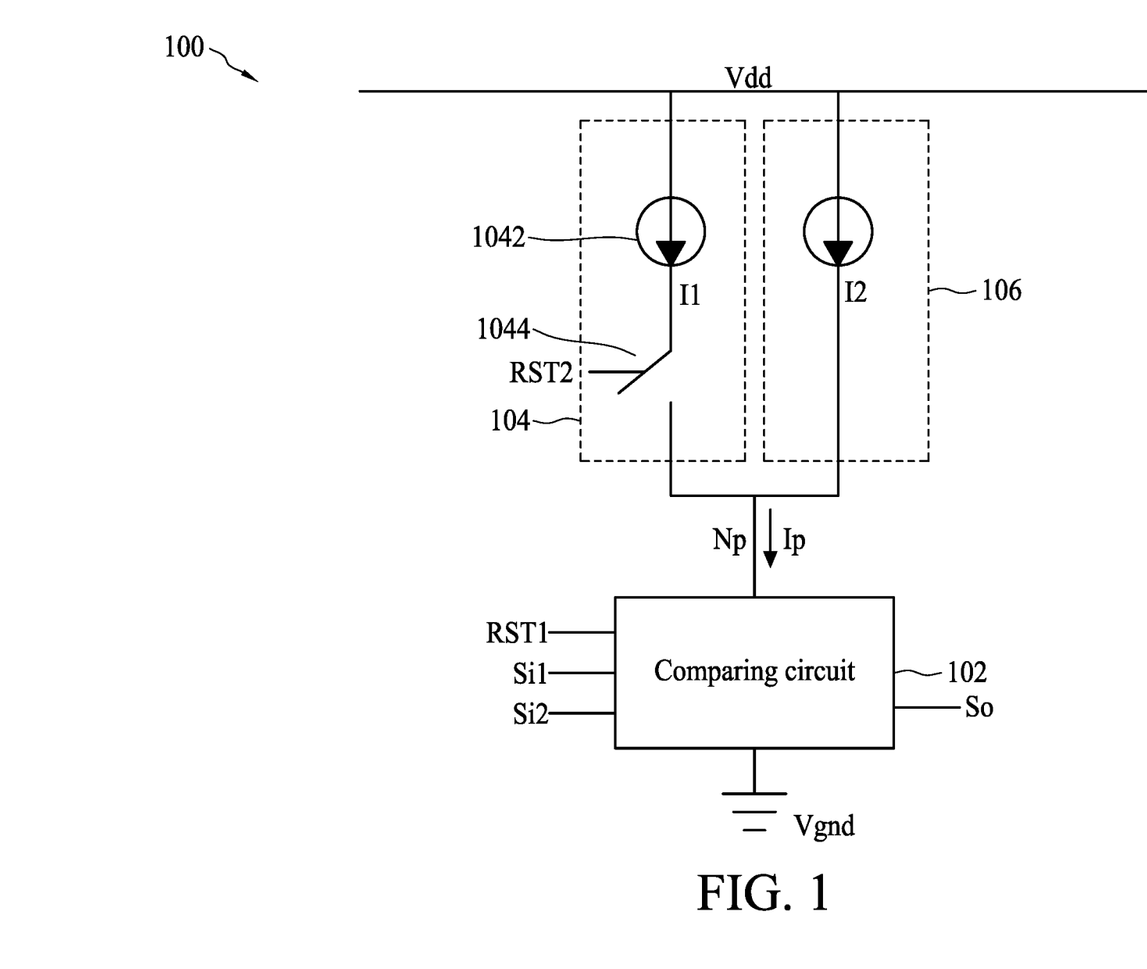
FIG. 1 is a diagram illustrating a comparing device in accordance with some embodiments.

FIG. 1 is a diagram illustrating a comparing device 100 in accordance with some embodiments. The comparing device 100 comprises a comparing circuit 102, a first current generating circuit 104, and a second current generating circuit 106. The comparing circuit 102 is arranged to output an output signal So according to a first input signal Si1, a second input signal Si2, a control signal RST1, and a supply current Ip. Specifically, the comparing circuit 102 is arranged to selectively compare the voltage level of the first input signal Si1 and the voltage level of the second input signal Si2 to generate the output signal So according to the control signal RST1. For example, when the comparing circuit 102 is enabled by the control signal RST1, the comparing circuit 102 generates the output signal So with a relatively high voltage level to indicate that the voltage level of the first input signal Si1 is higher than the voltage level of the second input signal Si2, and generates the output signal So with a relatively low voltage level to indicate that the voltage level of the first input signal Si1 is lower than the voltage level of the second input signal Si2. When the comparing circuit 102 is disabled or reset by the control signal RST1, the voltage level of the output signal So may be pulled or discharged to a predetermined voltage level irrespective of the voltage levels of the first input signal Si1 and the second input signal Si2. For example, the predetermined voltage level may be the supply voltage Vdd or the ground voltage Vgnd.

When the comparing circuit 102 is enabled by the control signal RST1, the comparing circuit 102 is arranged to receive the supply current Ip through a common node Np on the comparing circuit 102. According to some embodiments, the first current generating circuit 104 is coupled between a supply power Vdd and the common node Np for selectively generating a first current I1 to the common node Np according to a control signal RST2. For example, when the first current generating circuit 104 is enabled by the control signal RST2, the first current generating circuit 104 may generate the first current I1 to the common node Np. When the first current generating circuit 104 is disabled by the control signal RST2, the first current generating circuit 104 may not generate the first current I1 to the common node Np.

According to some embodiments, the first current generating circuit 104 comprises a current source 1042 and a switch 1044. A control terminal of the switch 1044 is arranged to receive the control signal RST2, a first connecting terminal of the switch 1044 is coupled to the common node Np, and a second connecting terminal of the switch 1044 is coupled to the current source 1042. The current source 1042 is coupled between the supply voltage Vdd and the second connecting terminal of the switch 1044 for generating the first current I1.

According to some embodiments, the control signals RST1 and RST2 may be the same control signal or in-phase with each other. However, this is not a limitation of the present embodiments. In one embodiment, the voltage level of the control signal RST1 may be partially overlapped with the voltage level of the control signal RST2. In another embodiment, the voltage level of the control signal RST1 may be the complementary voltage level of the control signal RST2.

In addition, the second current generating circuit 106 is coupled between the supply power Vdd and the common node Np for generating a second current I2 to the common node Np. According to some embodiments, the supply current Ip may be a total current of the first current I1 and the second current I2. Moreover, the second current generating circuit 106 may be a constant current source for generating a constant current, i.e. the second current I2. When the comparing device 100 is powered up, the second current generating circuit 106 may continuously provide the second current I2 to the comparing circuit 102 through the common node Np irrespective of the voltage levels of the control signal RST1 and/or the control signal RST2.

According to some embodiments, the current value of the second current I2 is smaller than the current value of the first current I1. For example, the current value of the second current I2 may be ten times smaller than the current value of the first current I1. It is noted that this example is not a limitation of the present embodiments.

According to some embodiments, when the control signals RST1 and RST2 enable the comparing circuit 102 and the first current generating circuit 104 respectively, the comparing circuit 102 may compare the voltage levels of the first input signal Si1 and the second input signal Si2 to output the output signal So accordingly. When the control signals RST1 and RST2 disable the comparing circuit 102 and the first current generating circuit 104 respectively, the comparing circuit 102 may stop compare the voltage levels of the first input signal Si1 and the second input signal Si2. However, the second current generating circuit 106 may continuously provide the second current I2 to the comparing circuit 102 through the common node Np when the comparing circuit 102 and the first current generating circuit 104 are disabled. Accordingly, the voltage level on the common node Np may be pre-charged into a specific voltage level when the comparing circuit 102 and the first current generating circuit 104 are disabled. It is noted that, if the second current generating circuit 106 is not applied, the voltage level on the common node Np may be discharged to a voltage level lower than the specific voltage level when the comparing circuit 102 and the first current generating circuit 104 are disabled.

Then, when the comparing circuit 102 and the first current generating circuit 104 are enabled again, the comparing circuit 102 may promptly compare the voltage levels of the first input signal Si1 and the second input signal Si2 as the voltage level on the common node Np has been pre-charged into the specific voltage level. In other words, by using the second current generating circuit 106, the decision time to transit the voltage levels of the output signals So1 and So2 based on the voltage levels of the first input signal Si1 and the second input signal Si2 is reduced in comparison to the counterpart without using the second current generating circuit 106. For example, the decision time of an embodiment is reduced about 15% in comparison to the counterpart without using the second current generating circuit 106. Accordingly, the operating speed of the comparing device 100 may be increased.

Figure 2:
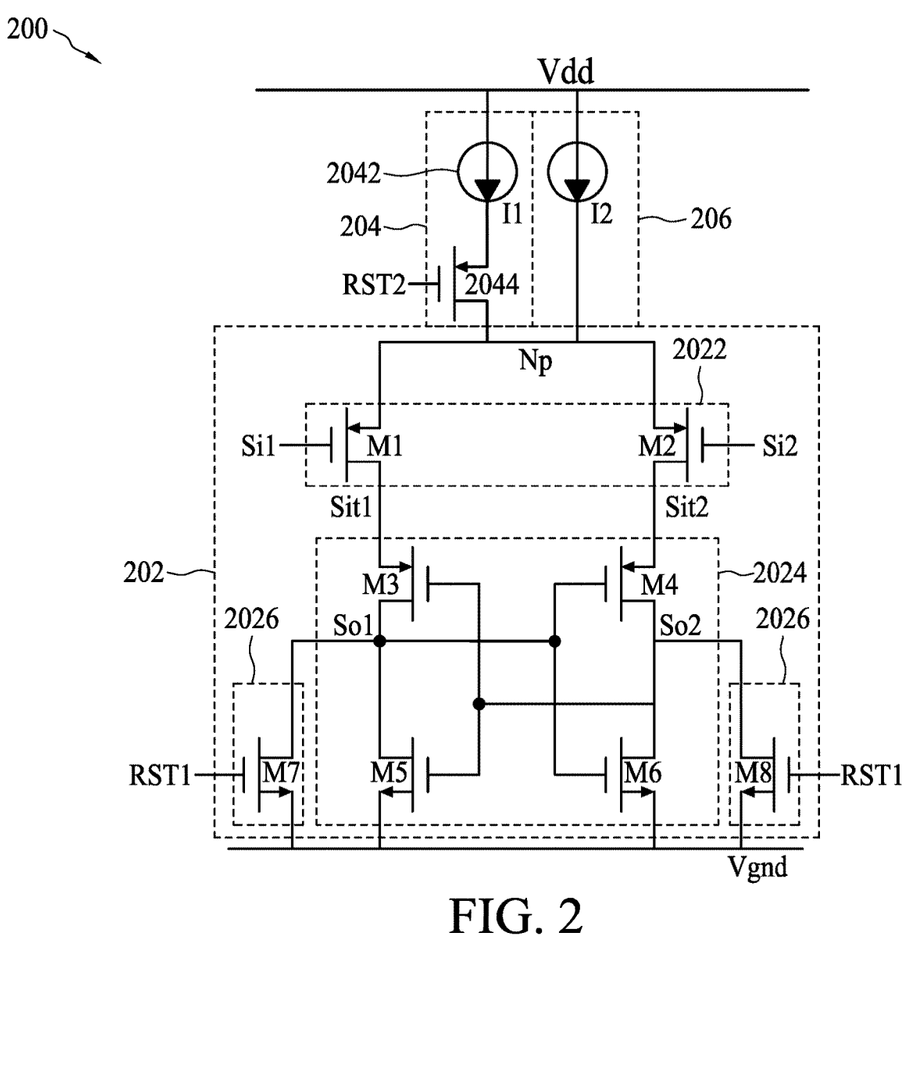
FIG. 2 is a schematic diagram illustrating a comparing device in accordance with some embodiments.

FIG. 2 is a schematic diagram illustrating a comparing device 200 in accordance with some embodiments. The comparing device 200 may be an implementation of the comparing device 100. For brevity, the signal labels in the comparing device 200 is similar to the signal labels in the comparing device 100. The comparing device 200 comprises a comparing circuit 202, a first current generating circuit 204, and a second current generating circuit 206. The comparing device 200 may be a differential comparator. The first current generating circuit 204 and the second current generating circuit 206 are coupled between the common node Np of the comparing circuit 202 and the supply voltage Vdd.

According to some embodiments, the first current generating circuit 204 comprises a current source 2042 and a transistor 2044. The transistor 2044 may be p-type metal-oxide-semiconductor field-effect transistor (p-type MOSFET). The gate of the transistor 2044 is arranged to receive the control signal RST2, the drain of the transistor 2044 is coupled to the common node Np, and the source of the transistor 2044 is coupled to the current source 2042. The current source 2042 is coupled between the supply voltage Vdd and the source of the transistor 2044 for generating the first current I1.

The second current generating circuit 206 is coupled between the supply power Vdd and the common node Np for generating the second current I2 to the common node Np.

The comparing circuit 202 comprises an input stage 2022, a latching stage 2024, and a reset circuit 2026. The input stage 2022 is arranged to receive the first input signal Si1 and the second input signal Si2 for generating a first intermediate signal Sit1 and a second intermediate signal Sit2. The first input signal Si1 and the second input signal Si2 may be differential input signals. The latching stage 2024 is coupled to the input stage 2022 for generating a first output signal So1 and a second output signal So2 according to the first intermediate signal Sit1 and the second intermediate signal Sit2. The first output signal So1 and the second output signal So2 may be differential output signals. The reset circuit 2026 is coupled to the output terminals of the latching stage 2024 to reset the latching stage 2024 according to the control signal RST1.

According to some embodiments, the input stage 2022 comprises a first transistor M1 and a second transistor M2. The transistors M1 and M2 may be p-type MOSFETs. The gates of the transistors M1 and M2 are arranged to receive the first input signal Si1 and the second input signal Si2 respectively. The sources of the transistors M1 and M2 are coupled to the common node Np. The drains of the transistors M1 and M2 are coupled to the latching stage 2024 for outputting the first intermediate signal Sit1 and the second intermediate signal Sit2 respectively.

The latching stage 2024 comprises a first transistor M3, a second transistor M4, a third transistor M5, and a fourth transistor M6. The transistors M3 and M4 may be p-type MOSFETs. The transistors M5 and M6 may be n-type MOSFETs. The sources of the transistor M3 and M4 are coupled to the drains of the transistors M1 and M2 respectively. The drains of the transistor M3 and M4 are coupled to the drains of the transistors M5 and M6 respectively. The sources of the transistors M5 and M6 are coupled to the ground voltage Vgnd. Moreover, the gate of the transistor M3 is coupled to the gate of the transistor M5 and the drain of the transistor M4 as well as the drain of the transistor M6. The gate of the transistor M4 is coupled to the gate of the transistor M6 and the drain of the transistor M3 as well as the drain of the transistor M5. According to some embodiments, the drains of the transistors M3 and M4 are arranged to output the first output signal So1 and the second output signal So2 respectively. According to some embodiments, merely one of the drains of the transistors M3 and M4 is arranged to output an output signal So (e.g. the first output signal So1 or the second output signal So2).

The reset circuit 2026 comprises a first transistor M7 and a second transistor M8. The transistor M7 and M8 may be n-type MOSFETs. The gates of the transistors M7 and M8 are coupled to the control signal RST1. The drains of the transistors M7 and M8 are coupled to the drains of the transistors M3 and M4 respectively. The sources of the transistors M7 and M8 are coupled to the ground voltage Vgnd.

The control signals RST1 and RST2 are configured to be the same control signal. Therefore, the control signals RST1 and RST2 are simplified as a control signal RST in the following paragraphs for brevity. Moreover, the control signal RST is a clock signal transiting between a high voltage level and a low voltage level. The high voltage level and the low voltage level may be the supply voltage Vdd and the ground voltage Vgnd respectively. When the voltage level of the control signal RST is the high voltage level, the comparing device 200 is reset. More specifically, the voltage level of the control signal RST is the high voltage level, the transistor 2044 is turned off, and the transistors M7 and M8 are turned on to discharge the voltage levels on the drains (i.e. the output signals So1 and So2) of the transistors M3 and M4 into the ground voltage Vgnd, respectively, to reset the latching stage 2024. Meanwhile, the second current generating circuit 206 continuously provides the second current I2 to the transistors M1 and/or M2 (i.e. the common node Np). Accordingly, the voltage level on the sources (i.e. the common node Np) of the transistors M1 and M2 may be kept on a specific voltage level such that the transistor M1 and/or the transistor M2 may be turned on. For example, the specific voltage level may be about the threshold voltage Vth of the transistors M1 and M2. It is noted that, based on the voltage levels of the input signals Si1 and Si2, one or both of the transistors M1 and M2 is turned on when the voltage level of the control signal RST is the high voltage level.

When the voltage level of the control signal RST is changed to the low voltage level, the comparing device 200 is turned on to compare the voltage levels of the input signals Si1 and Si2. More specifically, the transistor 2044 is turned on for providing the first current I1 to the transistors M1 and M2, and the transistors M7 and M8 are turned off to resume the function of the latching stage 2024.

According to some embodiments, as the transistor M1 and/or the transistor M2 are turned on when the voltage level of the control signal RST is the high voltage level, the transistor M1 and the transistor M2 may promptly response to the voltage levels of the input signals Si1 and Sil at the time the voltage level of the control signal RST is changed to the low voltage level from the high voltage level. Accordingly, the latching stage 2024 may promptly latch the voltage levels on the drains of the transistors M3 and M4 to generate the output signal So1 and So2 when the voltage level of the control signal RST is changed to the low voltage level from the high voltage level. Therefore, the operating speed of the comparing device 200 may be increased.

Figure 3:
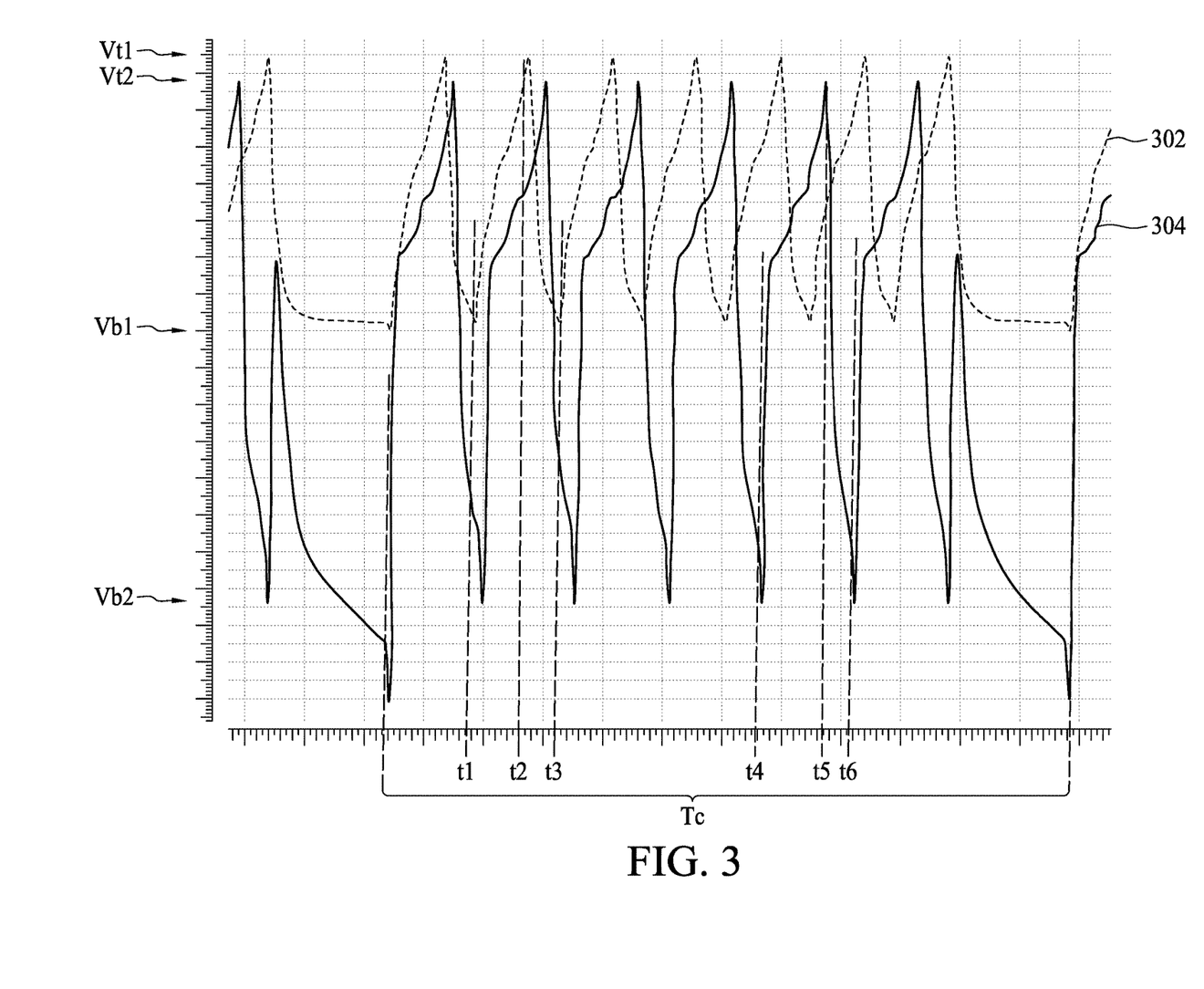
FIG. 3 is a timing diagram illustrating a voltage level on a common node of a comparing device in accordance with some embodiments.

FIG. 3 is a timing diagram illustrating a voltage level on the common node Np of the comparing device 200 in accordance with some embodiments. The waveform 302 may be the variation of the voltage level on the common node Np with the second current generating circuit 206 in response to the control signal RST and the input signals Si1 and Sil2. To compare the effect of the second current generating circuit 206, a waveform 304 is also shown in FIG. 3, in which the waveform 304 may be the variation of the voltage level on the common node Np without the second current generating circuit 206 in response to the control signal RST and the input signals Si1 and Sil2. The control signal RST is a periodic clock signal (not shown in FIG. 3) switching between the high voltage level Vdd and the low voltage level Vgnd.

For the waveform 302, when the voltage level of the control signal RST is changed to the high voltage level Vdd from the low voltage level Vgnd, the voltage level of the common node Np is also changed to the high voltage level Vt1 from the low voltage level Vb1. For example, at time t1, the voltage level of the common node Np reaches the low voltage level Vb1, and at time t2, the voltage level of the common node Np reaches the high voltage level Vt1. When the voltage level of the control signal RST is changed to the low voltage level Vgnd from the high voltage level Vdd, the voltage level of the common node Np is also changed to the low voltage level Vb1 from the high voltage level Vt1. For example, at time t2, the voltage level of the common node Np reaches the high voltage level Vt1, and at time t3, the voltage level of the common node Np reaches the low voltage level Vb1.

On the other hand, for the waveform 304, when the voltage level of the control signal RST is changed to the high voltage level Vdd from the low voltage level Vgnd, the voltage level of the common node Np is also changed to the high voltage level Vt2 from the low voltage level Vb2. For example, at time t4, the voltage level of the common node Np reaches the low voltage level Vb2, and at time t5, the voltage level of the common node Np reaches the high voltage level Vt2. When the voltage level of the control signal RST is changed to the low voltage level Vgnd from the high voltage level Vdd, the voltage level of the common node Np is also changed to the low voltage level Vb2 from the high voltage level Vt2. For example, at time t5, the voltage level of the common node Np reaches the high voltage level Vt2, and at time t6, the voltage level of the common node Np reaches the low voltage level Vb2.

By comparing the waveforms 302 and 304, the high voltage level Vt2 is closed to the high voltage level Vt1, and the low voltage level Vb2, however, is much lower than the low voltage level Vb1. For example, the high voltage levels Vt1 and Vt2 may be about 0.7V, the low voltage levels Vb1 may be about 0.6V, and the low voltage levels Vb2 may be about 0.41V. When the low voltage level Vb1 is much higher than the low voltage level Vb2, the waveform 302 may need less time to reach the high voltage level Vt1 from the low voltage level Vb1 in comparison to the waveform 304. Therefore, the reaction speed of the input stage 2022 with the second current generating circuit 206 is faster than the reaction speed of the input stage 2022 without the second current generating circuit 206. Accordingly, the cycle number of the waveform 302 is more than the cycle number of the waveform 304 within a predetermined comparing period Tc. For example, in the predetermined comparing period Tc, the cycle number of the waveform 302 is 7 and the cycle number of the waveform 304 is 6. In other words, the comparing device 200 with the second current generating circuit 206 may compare 7 times of the input signals Si1 and Si2 within the predetermined comparing period Tc, and the comparing device 200 without the second current generating circuit 206 only compares 6 times of the input signals Si1 and Si2 within the predetermined comparing period Tc. According to some embodiments, the comparing device 200 with the second current generating circuit 206 may perform 7-bit cycling at 1.75 GHz, and the comparing device 200 without the second current generating circuit 206 may only perform 6-bit cycling at 1.75 GHz.

Figure 4:
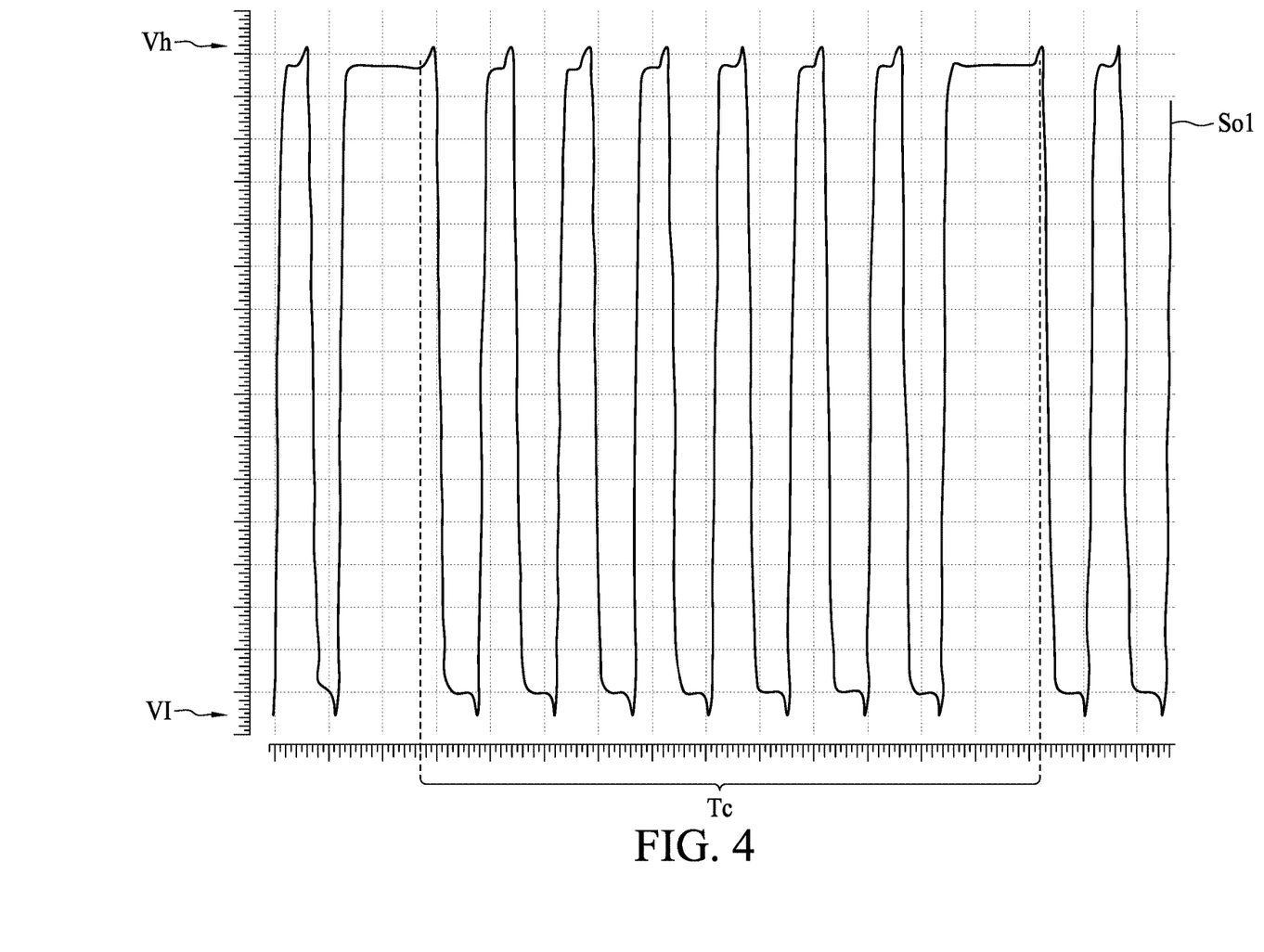
FIG. 4 is a timing diagram illustrating a voltage level of one of the output signals of a comparing device in accordance with some embodiments.

FIG. 4 is a timing diagram illustrating a voltage level of one of the output signals So1 and So2 of the comparing device 200 in accordance with some embodiments. During the predetermined comparing period Tc, the first output signal So1 and the second output signal So2 are differential.

Therefore, for brevity, merely the first output signal So1 is shown in FIG. 4. According to some embodiments, in the predetermined comparing period Tc, the comparing device 200 may perform 7 times of comparison upon the input signals Si1 and Si2. Therefore, the output signal So1 may output 7 clock cycles in the predetermined comparing period Tc. Without using the second current generating circuit 206, the comparing device 200 may only output 6 clock cycles of the output signal So1 in the predetermined comparing period Tc. Accordingly, the comparing device 200 may have faster operating speed.

According to some embodiments, the second current I2 generated by the second current generating circuit 206 is designed to be much smaller than the first current I1 generated by the first current generating circuit 204, therefore the present comparing device 200 may still have a relatively small power consumption.

According to some embodiments, as the second current generating circuit 206 is always turned on in the predetermined comparing period Tc, the transistors M7 and M8 in the reset circuit 2026 may be designed to have a relatively large size such that the transistors M7 and M8 may have enough power to reset the latching stage 2024. More specifically, the currents of transistors M7 and M8 may be large enough to discharge or pull the voltage level on the output terminals (i.e. the drains of the transistors M3 and M4) of the latching stage 2024 to the ground voltage Vgnd for resetting the latching stage 2024 when the voltage level of the control signal RST is changed to the high voltage level Vdd from the low voltage level Vgnd.

Figure 5:
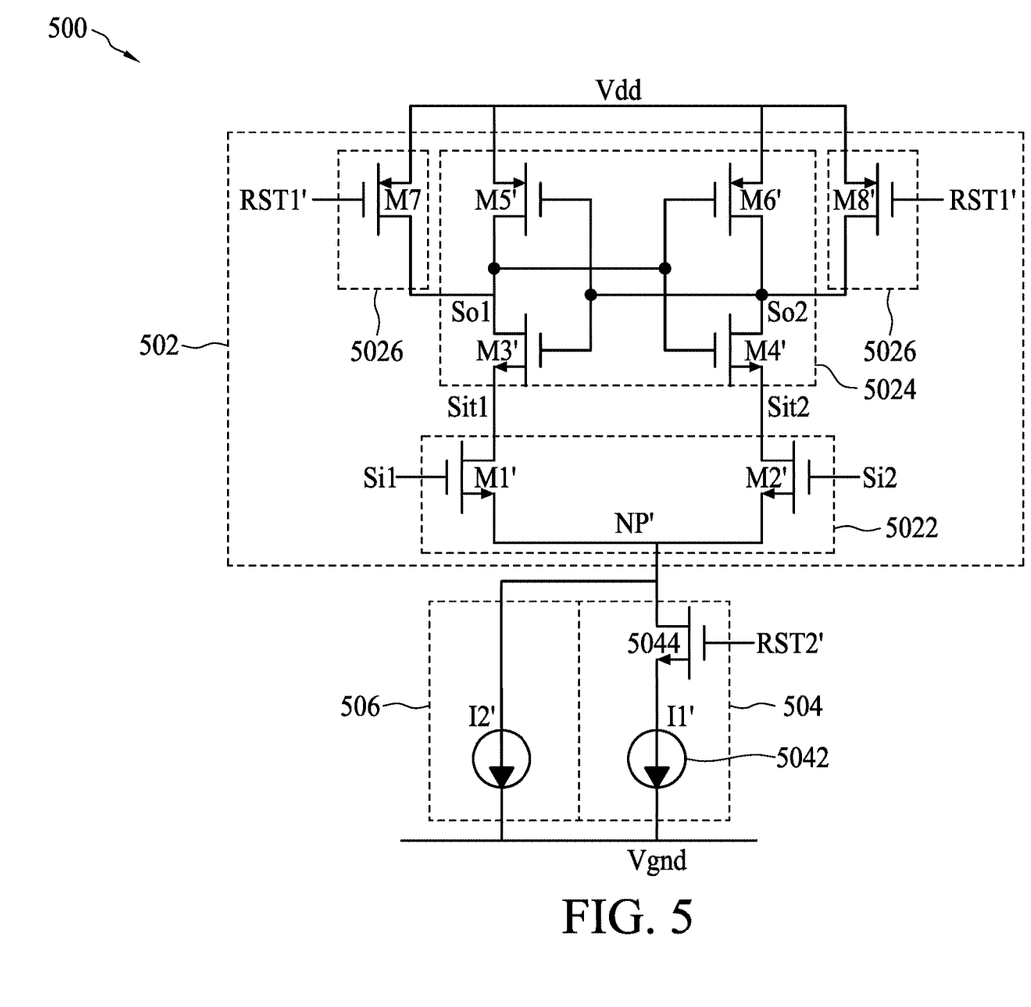
FIG. 5 is a schematic diagram illustrating a comparing device in accordance with some embodiments.

FIG. 5 is a schematic diagram illustrating a comparing device 500 in accordance with some embodiments. The comparing device 500 may be another implementation of the comparing device 100. For brevity, the signal labels in the comparing device 500 is similar to the signal labels in the comparing device 100. The comparing device 500 comprises a comparing circuit 502, a first current generating circuit 504, and a second current generating circuit 506. The comparing device 500 may be a differential comparator. The first current generating circuit 504 and the second current generating circuit 506 are coupled between the common node Np' of the comparing circuit 502 and the ground voltage Vgnd.

In comparison to the comparing device 200, the comparing device 500 is the complementary version of the comparing device 200. More specifically, the first current generating circuit 504 comprises a current source 5042 and a transistor 5044. The transistor 5044 may be n-type MOSFET. The gate of the transistor 5044 is arranged to receive the control signal RST2', the drain of the transistor 5044 is coupled to the common node Np', and the source of the transistor 5044 is coupled to the current source 5042. The current source 5042 is coupled between the ground voltage Vgnd and the source of the transistor 5044 for generating the first current I1'.

The second current generating circuit 506 is coupled between the ground voltage Vgnd and the common node Np' for generating the second current I2' to the common node Np'.

The comparing circuit 502 comprises an input stage 5022, a latching stage 5024, and a reset circuit 5026. The input stage 5022 is arranged to receive the first input signal Si1' and the second input signal Si2' to generate the first intermediate signal Sit1' and the second intermediate signal Sit2'. The latching stage 5024 is coupled to the input stage 5022 for generating a first output signal So1' and a second output signal So2' according to the first intermediate signal Sit1' and the second intermediate signal Sit2'. The reset circuit 5026 is coupled to the output terminals of the latching stage 5024 to reset the latching stage 5024 according to the control signal RST1'.

According to some embodiments, the input stage 5022 comprises a first transistor M1' and a second transistor M2'. The transistors M1' and M2' may be n-type MOSFETs. The gates of the transistors M1' and M2' are arranged to receive the first input signal Si1' and the second input signal Si2' respectively. The sources of the transistors M1' and M2' are coupled to the common node Np'. The drains of the transistors M1' and M2' are coupled to the latching stage 5024 to output the first intermediate signal Sit1' and the second intermediate signal Sit2'.

The latching stage 5024 comprises a first transistor M3', a second transistor M4', a third transistor M5', and a fourth transistor M6'. The transistors M3' and M4' may be n-type MOSFETs. The transistors M5' and M6' may be p-type MOSFETs. The sources of the transistor M3' and M4' are coupled to the drains of the transistors M1' and M2' respectively. The drains of the transistor M3' and M4' are coupled to the drains of the transistors M5' and M6' respectively. The sources of the transistors M5' and M6' are coupled to the supply voltage Vdd. Moreover, the gate of the transistor M3' is coupled to the gate of the transistor M5' and the drain of the transistor M4' as well as the drain of the transistor M6'. The gate of the transistor M4' is coupled to the gate of the transistor M6' and the drain of the transistor M3' as well as the drain of the transistor M5'. According to some embodiments, the drains of the transistors M3' and M4' are arranged to output the first output signal So1' and the second output signal So2' respectively.

The reset circuit 5026 comprises a first transistor M7' and a second transistor M8'. The transistor M7' and M8' may be n-type MOSFETs. The gates of the transistors M7' and M8' are coupled to the control signal RST1'. The drains of the transistors M7' and M8' are coupled to the drains of the transistors M3' and M4' respectively. The sources of the transistors M7' and M8' are coupled to the supply voltage Vdd.

The control signals RST1' and RST2' are configured to be the same control signal. For brevity, the control signals RST1' and RST2' are simplified as a control signal RST1' in the following paragraphs. Moreover, the control signal RST1' is a clock signal transiting between a high voltage level and a low voltage level. The high voltage level and the low voltage level may be the supply voltage Vdd and the ground voltage Vgnd respectively. When the voltage level of the control signal RST1' is the low voltage level, the comparing device 500 is reset. When the comparing device 500 is reset, the second current generating circuit 506 continuously provides the second current I2' to the transistors M1' and/or M2' (i.e. the common node Np'). Accordingly, the voltage level on the sources (i.e. the common node Np') of the transistors M1' and M2' may be kept on a specific voltage level such that the transistor M1' and/or the transistor M2' may be turned on.

According to some embodiments, as the transistor M1' and/or the transistor M2' are turned on when the voltage level of the control signal RST1' is the low voltage level, the transistor M1' and the transistor M2' may promptly response to the voltage levels of the input signals Si1' and Sil' at the time the voltage level of the control signal RST1' is changed to the high voltage level from the low voltage level. Accordingly, the latching stage 5024 may promptly latch the voltage levels on the drains of the transistors M3' and M4' to generate the output signal So1' and So2' when the voltage level of the control signal RST1' is changed to the high voltage level from the low voltage level. Therefore, the operating speed of the comparing device 500 may be increased.

The detailed operation and the advantages of the comparing device 500 are similar to the comparing device 200, thus the detailed description is omitted here for brevity.

Figure 6:
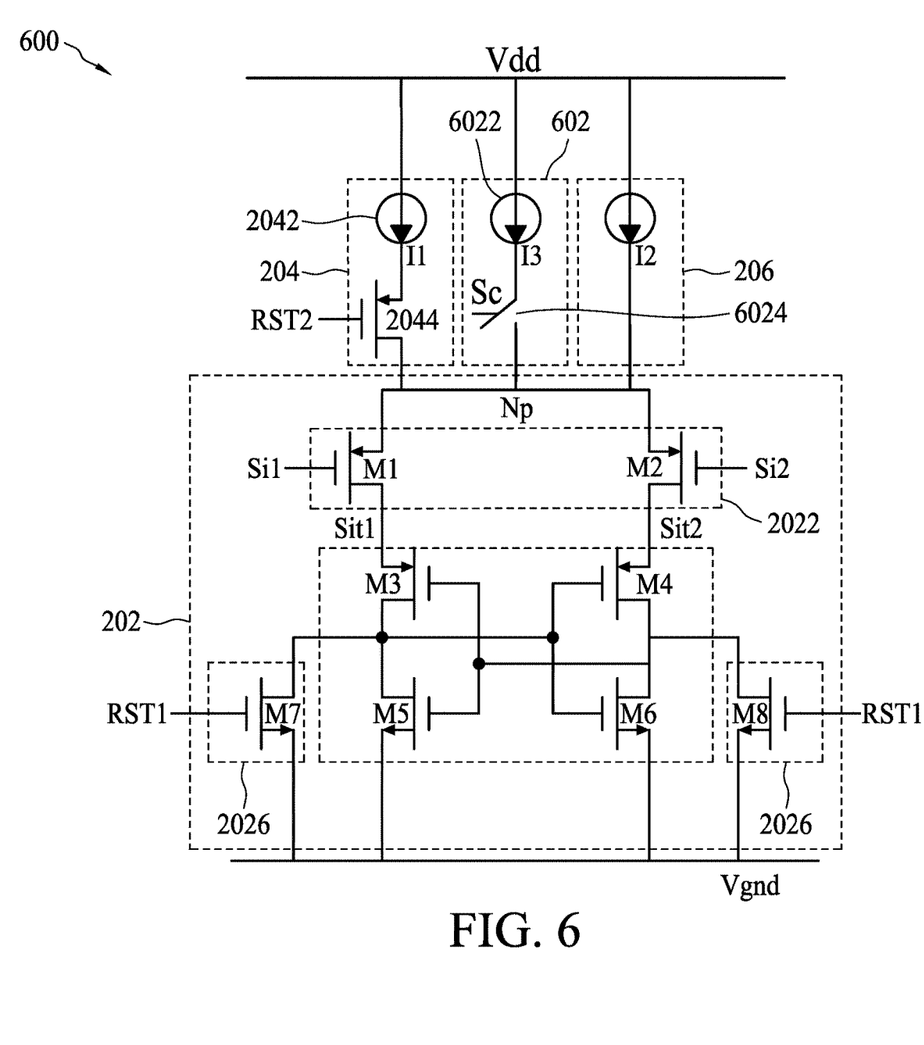
FIG. 6 is a schematic diagram illustrating a comparing device in accordance with some embodiments.

FIG. 6 is a schematic diagram illustrating a comparing device 600 in accordance with some embodiments. In comparison to the comparing device 200, the comparing device 600 further comprises a third current generating circuit 602 coupled between the common node Np of the comparing circuit 202 and the supply voltage Vdd. For brevity, the elements and signal labels in the comparing device 600 are similar to the comparing device 200.

According to some embodiments, the third current generating circuit 602 comprises a current source 6022 and a switch 6024. A control terminal of the switch 6024 is arranged to receive a control signal Sc, a first connecting terminal of the switch 6024 is coupled to the common node Np, and a second connecting terminal of the switch 6024 is coupled to the current source 6022. The current source 6022 is coupled between the supply voltage Vdd and the second connecting terminal of the switch 6024 for generating a third current I3. According to some embodiments, the value of the third current I3 may be smaller than the second current I2.

The third current generating circuit 602 may be configured to deal with the process corners occurred in the fabrication such that the operating speed of the comparing device 600 may be tuned or adjusted after the fabrication. The process corner may be a variation of fabrication parameters used in applying an integrated circuit design to a semiconductor wafer. For example, the process corner may be fast-fast (FF), slow-slow (SS), slow-fast (SF), or fast-slow (FS) corner, in which the first letter (e.g. "F" in FS corner) refers to the N-channel MOSFET (NMOS) corner, and the second letter (e.g. "S" in FS corner) refers to the P channel (PMOS) corner. For example, when the process corner is FS corner, the switch 6024 may be turned on by the control signal Sc to provide an additional current I3 to the transistors M1 and M2 of the latching stage 2022 during the predetermined comparing period Tc.

According to some embodiments, the third current generating circuit 602 may be modified to have a plurality of current sources coupled to a plurality of switches respectively. The plurality of switches may be controlled by a plurality of digital control signals respectively. Accordingly, the modified current generating circuit 602 may generate different currents to adjust the comparing device 600 after the fabrication.

It is noted that, after modification, the third current generating circuit 602 may also be applied in the comparing device 500, and the detailed description is omitted here for brevity.

Figure 7:
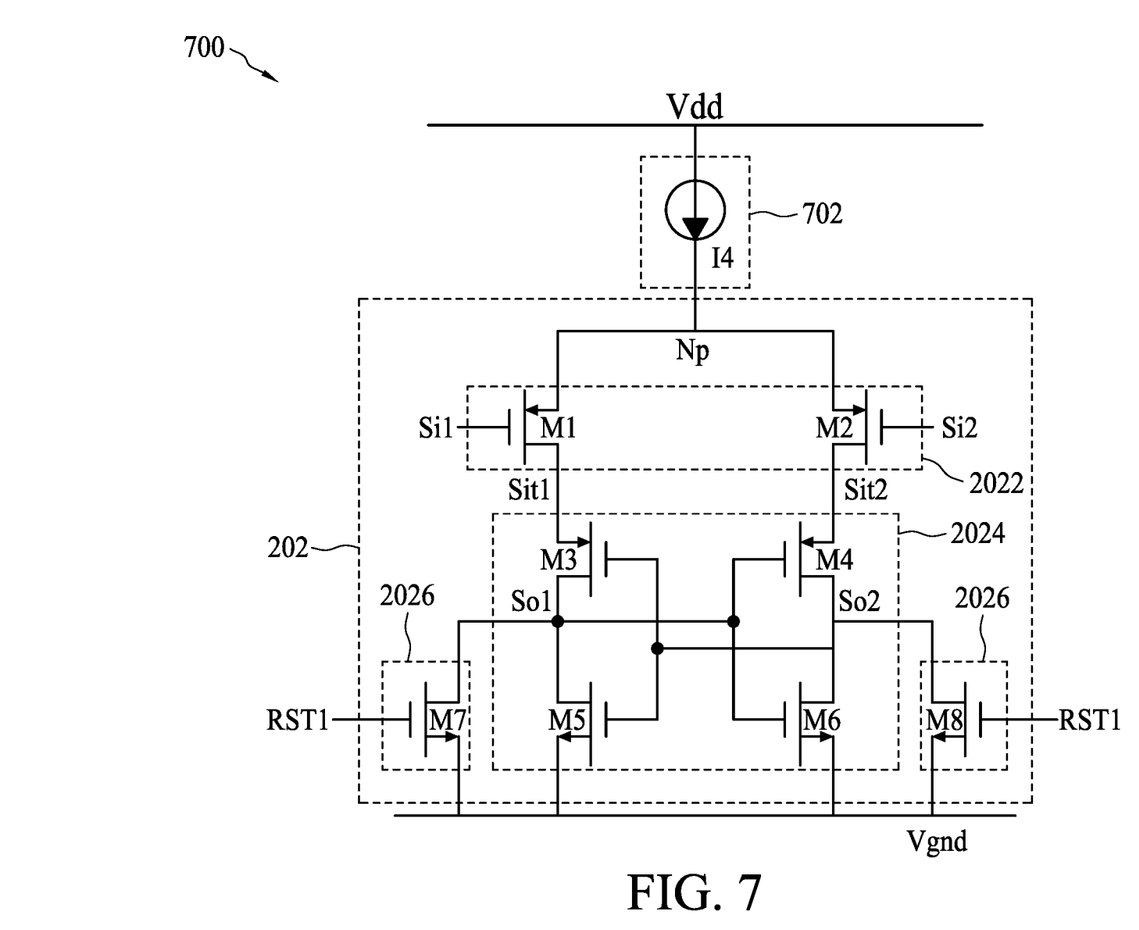
FIG. 7 is a schematic diagram illustrating a comparing device in accordance with some embodiments.

FIG. 7 is a schematic diagram illustrating a comparing device 700 in accordance with some embodiments. In comparison to the comparing device 200, the current generating circuits 204 and 206 in the comparing device 200 are replaced with a current generating circuit 702 in the comparing device 700. For brevity, the elements and signal labels in the comparing device 700 are similar to the comparing device 200.

According to some embodiments, the current generating circuit 702 is a current source having a first terminal coupled to the common node Np of the comparing circuit 202 and a second terminal coupled to the supply voltage Vdd. The current generating circuit 702 is arranged to continuous generate a current I4 to the comparing circuit 202 during the predetermined comparing period Tc. When the current I4 is continuously provided to the comparing circuit 202, the voltage level on the common node Np may be kept on a relatively high voltage level when the latching stage 2024 is reset, i.e. the voltage level of the control signal RST1 is the low voltage level, in the predetermined comparing period Tc. Accordingly, the transistor M1 and the transistor M2 may promptly response to the voltage levels of the input signals Si1 and Si1 at the time the voltage level of the control signal RST1 is changed to the low voltage level from the high voltage level. Therefore, the operating speed of the comparing device 700 may be increased.

As the current generating circuit 702 is arranged to continuous generate the current I4 to the comparing circuit 202 when the comparing circuit 202 is reset or disabled by the control signal RST1, the power consumption of the comparing device 700 may greater than the power consumption of the comparing device 200. Moreover, the transistors M7 and M8 in the comparing device 700 may be designed to have a relatively large size such that the transistors M7 and M8 may discharge or pull the voltage level on the output terminals (i.e. the drains of the transistors M3 and M4) of the latching stage 2024 to the ground voltage Vgnd for resetting the latching stage 2024 when the voltage level of the control signal RST1 is changed to the high voltage level Vdd from the low voltage level Vgnd. According to some embodiments, the size of the transistors M7 and M8 in the comparing device 700 is greater than the size of the transistors M7 and M8 in the comparing device 200.

Figure 8:
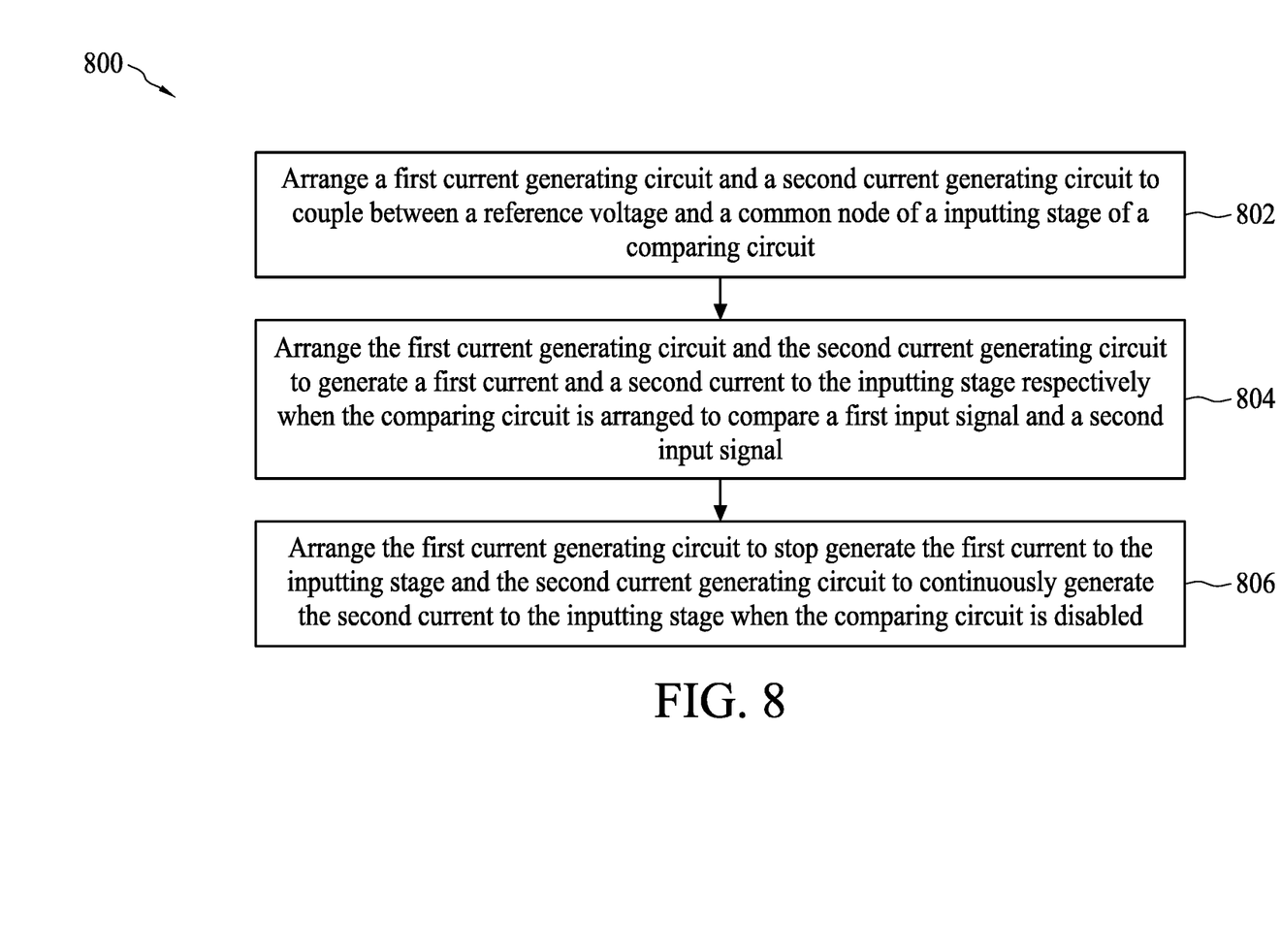
FIG. 8 is a flowchart of a method for controlling a comparing device in accordance with some embodiments.

According to some embodiments, the operation of the comparing device 100, 200, 500, 600, or 700 may be summarized into the operations in FIG. 8. FIG. 8 is a flowchart of a method 800 for controlling a comparing device in accordance with some embodiments. The comparing device may be the comparing device 100, 200, 500, 600, or 700. The method 800 comprises operations 802-806. In operation 802, a first current generating circuit (e.g. 204) and a second current generating circuit (e.g. 206) are arranged to couple between a reference voltage (e.g. Vdd) and a common node (e.g. Np) of an input stage (e.g. 2022) of a comparing circuit (e.g. 202). According to some embodiments, the first current generating circuit (e.g. 204) is controlled by a control signal (e.g. RST2). The common node may be a common source of a differential pairs (e.g. the input stage).

In operation 804, the first current generating circuit and the second current generating circuit are arranged to generate a first current (e.g. I1) and a second current (e.g. I2) to the input stage (e.g. 2022) via the common node, respectively, when the comparing circuit is arranged to compare the voltage levels of a first input signal (e.g. Si1) and a second input signal (e.g. S2) received by the input stage. Specifically, when the comparing circuit compares the voltage level of the first input signal and the second input signal, the current generating circuits 204 and 206 generate the currents I1 and I2 to the comparing circuit 202 respectively.

In operation 806, the first current generating circuit (e.g. 204) is arranged to stop generate the first current (e.g. I1) to the input stage (e.g. 2022) and the second current generating circuit (e.g. 206) is arranged to continuously generate the second current (e.g. I2) to the input stage (e.g. 2022) via the common node when the comparing circuit (e.g. 202) is reset. According to some embodiments, the second current is greater than the first current.

According to the operations 802-806 of the method 800, the voltage level on the common node Np may be pre-charged into a specific voltage level by the current I2 when the comparing circuit 202 and the current generating circuit 204 are disabled or reset. Then, when the comparing circuit 202 and the current generating circuit 204 are enabled again, the comparing circuit 202 may promptly compare the voltage levels of the first input signal Si1 and the second input signal Si2. Accordingly, by using the method 800, the operating speed of the comparing device 200 may be increased.

Briefly, according to the embodiments, the common node of the input pair of the comparing circuit is pre-charged into a specific voltage level when the comparing circuit is reset or disabled. Then, when the comparing circuit is enabled again, the comparing circuit may save the decision time to latch the voltage levels of the output signals based on the voltage levels of input signals on the input stage. Therefore, the operating speed of the presented comparing devices may be increased.

In some embodiments, the present disclosure provides a comparing device. The comparing device comprises a first current generating circuit, a second current generating circuit, and a comparing circuit. The first current generating circuit is arranged to selectively generate a first current according to a first control signal. The second current generating circuit is arranged to generate a second current. The comparing circuit having a common node coupled to the first current generating circuit and the second current generating circuit for comparing a first input signal and a second input signal to generate an output signal according to the first current, the second current, and a second control signal.

In some embodiments, the present disclosure provides a comparing device. The comparing device comprises a current generating circuit and a comparing circuit. The current generating circuit is arranged to generate a current. The comparing circuit having a common node coupled to the current generating circuit for comparing a first input signal and a second input signal to generate an output signal according to the current and a control signal; wherein when the control signal resets the comparing circuit, the current generating circuit continuous generates the current to the comparing circuit through the common node.

In some embodiments, the present disclosure provides a method of controlling a comparing device. The method comprises: arranging a first current generating circuit to couple between a reference voltage and a common node of an input stage of a comparing circuit; arranging the first current generating circuit to generate a first current to the input stage via the common node when the comparing circuit is arranged to compare a first input signal and a second input signal; and arranging the first current generating circuit to generate the first current to the input stage via the common node when the comparing circuit is disabled.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A comparing device, comprising:
a first current generating circuit, arranged to selectively generate a first current according to a first control signal;
a second current generating circuit, arranged to generate a second current; and
a comparing circuit, having a common node coupled to the first current generating circuit and the second current generating circuit, for comparing a first input signal and a second input signal to generate an output signal according to the first current, the second current, and a second control signal,
wherein the second control signal and the first control signal are in-phase with each other.

2. The comparing device of claim 1, further comprising:
a third current generating circuit, coupled to the common node, for selectively generating a third current according to a third control signal;
wherein the third control signal is different from the first control signal and the second control signal.

3. The comparing device of claim 2, wherein the third current generating circuit comprises:
a current source, coupled to a reference voltage for generating the third current; and
a switch, having a first connecting terminal coupled to the current source, a second connecting terminal coupled to the common node, and a control terminal for receiving the third control signal.

4. The comparing device of claim 2, wherein the third current is smaller than the first current.

5. The comparing device of claim 1, wherein the second current is smaller than the first current.

6. The comparing device of claim 1, wherein the second current generating circuit is arranged to continuously generate the second current to the common node of the comparing circuit when the comparing circuit is disabled by the second control signal.

7. The comparing device of claim 1, wherein the first current generating circuit comprises:
a current source, coupled to a reference voltage for generating the first current; and
a switch, having a first connecting terminal coupled to the current source, a second connecting terminal coupled to the common node, and a control terminal for receiving the first control signal.

8. The comparing device of claim 1, wherein the comparing circuit comprises:
an input stage, having the common node coupled to the first current generating circuit and the second current generating circuit, and having a first input terminal and a second input terminal for receiving the first input signal and the second input signal to generate a first intermediate signal and a second intermediate signal;
a latching stage, coupled to the input stage, for generating the output signal on an output terminal according to the first intermediate signal and the second intermediate signal; and
a reset circuit, coupled to the output terminal, for resetting the latching stage according to the second control signal.

9. The comparing device of claim 8, wherein the input stage comprises:
a first transistor, having a first connecting terminal coupled to the common node, a second connecting terminal outputted the first intermediate signal, and a control terminal coupled to the first input signal; and a second transistor, having a first connecting terminal coupled to the common node, a second connecting terminal outputted the second intermediate signal, and a control terminal coupled to the second input signal;

the latching stage comprises:
a third transistor, having a first connecting terminal coupled to the second connecting terminal of the first transistor;
a fourth transistor, having a first connecting terminal coupled to the second connecting terminal of the second transistor;
a fifth transistor, having a first connecting terminal coupled to a reference voltage, a second connecting terminal coupled to a second connecting terminal of the third transistor and a control terminal of the fourth transistor, and a control terminal coupled to a control terminal of the third transistor and a second connecting terminal of the fourth transistor; and
a sixth transistor, having a first connecting terminal coupled to the reference voltage, a second connecting terminal coupled to the second connecting terminal of the fourth transistor, and a control terminal coupled to the control terminal of the fourth transistor; and the reset circuit comprises:
a seventh transistor, having a first connecting terminal coupled to the reference voltage, a second connecting terminal coupled to the second connecting terminal of the third transistor, and a control terminal for receiving the second control signal; and
an eighth transistor, having a first connecting terminal coupled to the reference voltage, a second connecting terminal coupled to the second connecting terminal of the fourth transistor, and a control terminal for receiving the second control signal,
wherein one of the second connecting terminal of the third transistor and the second connecting terminal of the fourth transistor is arranged to output the output signal.

10. The comparing device of claim 9, wherein the first transistor, the second transistor, the third transistor, and the fourth transistor are p-type metal-oxide-semiconductor field-effect transistor (p-type MOSFET), and the fifth transistor, the sixth transistor, the seven transistor, and the eighth transistor are n-type metal-oxide-semiconductor field-effect transistor (n-type MOSFET).

11. The comparing device of claim 9, wherein the first transistor, the second transistor, the third transistor, and the fourth transistor are n-type MOSFET, and the fifth transistor, the sixth transistor, the seven transistor, and the eighth transistor are p-type MOSFET.

12. A comparing device, comprising:
a current generating circuit, arranged to generate a current; and
a comparing circuit, having a common node coupled to the current generating circuit, for comparing a first input signal and a second input signal to generate an output signal according to the current and a control signal, the comparing circuit comprising:
an input stage, having the common node coupled to the current generating circuit, and having a first input terminal and a second input terminal for receiving the first input signal and the second input signal to generate a first intermediate signal and a second intermediate signal;
a latching stage, coupled to the input stage, for generating the output signal on an output terminal according to the first intermediate signal and the second intermediate signal; and a reset circuit, coupled to the output terminal, for resetting the latching stage according to the control signal,
wherein the input stage comprises:
a first transistor, having a first connecting terminal coupled to the common node, a second connecting terminal outputted the first intermediate signal, and a control terminal coupled to the first input signal; and
a second transistor, having a first connecting terminal coupled to the common node, a second connecting terminal outputted the second intermediate signal, and a control terminal coupled to the second input signal;
wherein the latching stage comprises:
a third transistor, having a first connecting terminal coupled to the second connecting terminal of the first transistor;
a fourth transistor, having a first connecting terminal coupled to the second connecting terminal of the second transistor;
a fifth transistor, having a first connecting terminal coupled to a reference voltage, a second connecting terminal coupled to a second connecting terminal of the third transistor and a control terminal of the fourth transistor, and a control terminal coupled to a control terminal of the third transistor and a second connecting terminal of the fourth transistor; and
a sixth transistor, having a first connecting terminal coupled to the reference voltage, a second connecting terminal coupled to the second connecting terminal of the fourth transistor, and a control terminal coupled to the control terminal of the fourth transistor; and
wherein the reset circuit comprises:
a seventh transistor, having a first connecting terminal coupled to the reference voltage, a second connecting terminal coupled to the second connecting terminal of the third transistor, and a control terminal for receiving the control signal; and
an eighth transistor, having a first connecting terminal coupled to the reference voltage, a second connecting terminal coupled to the second connecting terminal of the fourth transistor, and a control terminal for receiving the control signal,
wherein one of the second connecting terminal of the third transistor and the second connecting terminal of the fourth transistor is arranged to output the output signal,
wherein when the control signal resets the comparing circuit, the current generating circuit continuous generates the current to the comparing circuit through the common node.

13. The comparing device of claim 12, wherein the current generating circuit comprises:
a current source, having a first terminal coupled to a reference voltage and a second terminal coupled to the common node, for continuous generating the current to the common node of the comparing circuit.

14. The comparing device of claim 12, wherein the first transistor, the second transistor, the third transistor, and the fourth transistor are p-type metal-oxide-semiconductor field-effect transistor (p-type MOSFET), and the fifth transistor, the sixth transistor, the seven transistor, and the eighth transistor are n-type metal-oxide-semiconductor field-effect transistor (n-type MOSFET).

15. The comparing device of claim 12, wherein the first transistor, the second transistor, the third transistor, and the fourth transistor are n-type MOSFET, and the fifth transistor, the sixth transistor, the seven transistor, and the eighth transistor are p-type MOSFET.

16. A comparing device, comprising:
- a first current generating circuit, arranged to selectively generate a first current according to a first control signal;
- a second current generating circuit, arranged to generate a second current; and
- a comparing circuit, having a common node coupled to the first current generating circuit and the second current generating circuit, for comparing a first input signal and a second input signal to generate an output signal according to the first current, the second current, and a second control signal, wherein the comparing circuit comprises:
  - an input stage, having the common node coupled to the first current generating circuit and the second current generating circuit, and having a first input terminal and a second input terminal for receiving the first input signal and the second input signal to generate a first intermediate signal and a second intermediate signal;
  - a latching stage, coupled to the input stage, for generating the output signal on an output terminal according to the first intermediate signal and the second intermediate signal; and
  - a reset circuit, coupled to the output terminal, for resetting the latching stage according to the second control signal,
  - wherein the input stage comprises:
    - a first transistor, having a first connecting terminal coupled to the common node, a second connecting terminal outputted the first intermediate signal, and a control terminal coupled to the first input signal; and
    - a second transistor, having a first connecting terminal coupled to the common node, a second connecting terminal outputted the second intermediate signal, and a control terminal coupled to the second input signal;
  - wherein the latching stage comprises:
    - a third transistor, having a first connecting terminal coupled to the second connecting terminal of the first transistor;
    - a fourth transistor, having a first connecting terminal coupled to the second connecting terminal of the second transistor;
    - a fifth transistor, having a first connecting terminal coupled to a reference voltage, a second connecting terminal coupled to a second connecting terminal of the third transistor and a control terminal of the fourth transistor, and a control terminal coupled to a control terminal of the third transistor and a second connecting terminal of the fourth transistor; and
    - a sixth transistor, having a first connecting terminal coupled to the reference voltage, a second connecting terminal coupled to the second connecting terminal of the fourth transistor, and a control terminal coupled to the control terminal of the fourth transistor; and
  - wherein the reset circuit comprises:
    - a seventh transistor, having a first connecting terminal coupled to the reference voltage, a second connecting terminal coupled to the second connecting terminal of the third transistor, and a control terminal for receiving the second control signal; and
    - an eighth transistor, having a first connecting terminal coupled to the reference voltage, a second connecting terminal coupled to the second connecting terminal of the fourth transistor, and a control terminal for receiving the second control signal,
    - wherein one of the second connecting terminal of the third transistor and the second connecting terminal of the fourth transistor is arranged to output the output signal.

17. The comparing device of claim 16, wherein the first transistor, the second transistor, the third transistor, and the fourth transistor are p-type metal-oxide-semiconductor field-effect transistor (p-type MOSFET), and the fifth transistor, the sixth transistor, the seven transistor, and the eighth transistor are n-type metal-oxide-semiconductor field-effect transistor (n-type MOSFET).

18. The comparing device of claim 17, wherein the first transistor, the second transistor, the third transistor, and the fourth transistor are n-type MOSFET, and the fifth transistor, the sixth transistor, the seven transistor, and the eighth transistor are p-type MOSFET.

19. The comparing device of claim 16, further comprising:
- a third current generating circuit, coupled to the common node, for selectively generating a third current according to a third control signal,
- wherein the third control signal is different from the first control signal and the second control signal.

20. The comparing device of claim 16, wherein the first current generating circuit comprises:
- a current source, coupled to a reference voltage for generating the first current; and
- a switch, having a first connecting terminal coupled to the current source, a second connecting terminal coupled to the common node, and a control terminal for receiving the first control signal.

* * * * *